United States Patent
Szczyrbowski et al.

[11] Patent Number: 5,090,984
[45] Date of Patent: Feb. 25, 1992

[54] METHOD FOR PRODUCING GLASS OF HIGH TRANSMISSION IN THE VISIBLE SPECTRAL RANGE AND LOW SOLAR ENERGY TRANSMISSION

[75] Inventors: Joachim Szczyrbowski, Goldbach; Stefan Rögels, Erlensee; Anton Dietrich, Wiesenfelden; Klaus Hartig, Ronneburg, all of Fed. Rep. of Germany

[73] Assignee: Leybold Aktiengesellschaft, Hanau, Fed. Rep. of Germany

[21] Appl. No.: 516,810

[22] Filed: Apr. 30, 1990

Related U.S. Application Data

[63] Continuation of Ser. No. 189,768, May 3, 1988, abandoned.

[30] Foreign Application Priority Data

Feb. 26, 1988 [DE] Fed. Rep. of Germany ....... 3806124

[51] Int. Cl.⁵ .................. C03C 17/00; C03C 17/245; C03C 17/34
[52] U.S. Cl. ...................... 65/60.2; 65/60.5; 204/192.28; 204/192.29
[58] Field of Search ............... 65/60.2, 60.5; 204/192.15, 192.28, 192.29

[56] References Cited

U.S. PATENT DOCUMENTS

| | | | |
|---|---|---|---|
| 3,826,728 | 7/1974 | Chambers et al. | 204/192.15 |
| 4,336,119 | 6/1982 | Gillery | 204/192.29 |
| 4,400,254 | 8/1983 | Freller et al. | 204/192.29 |
| 4,548,691 | 10/1985 | Dietrich et al. | 204/192.29 |
| 4,832,809 | 5/1989 | Hodes | 204/192.15 |
| 4,857,094 | 8/1989 | Groth | 65/60.2 |
| 4,882,022 | 11/1989 | Hoffman | 204/192.15 |
| 4,891,113 | 1/1990 | Criss | 204/192.15 |
| 4,948,677 | 8/1990 | Gillery | 204/192.15 |

FOREIGN PATENT DOCUMENTS

| | | |
|---|---|---|
| 104870 | 4/1984 | European Pat. Off. . |
| 2839057 | 3/1979 | Fed. Rep. of Germany ...... 204/192.29 |
| 3138998 | 4/1983 | Fed. Rep. of Germany . |
| 3307661 | 6/1984 | Fed. Rep. of Germany . |
| 3611844 | 9/1987 | Fed. Rep. of Germany . |
| 2306175 | 10/1976 | France ...... 65/60.5 |
| 718189 | 11/1954 | United Kingdom ...... 204/192.29 |

*Primary Examiner*—Kenneth M. Schor
*Attorney, Agent, or Firm*—Felfe & Lynch

[57] ABSTRACT

In a method for the production of sheets of mineral glass with high transmission in the visible spectral range and with low solar energy transmission, a coating is sputtered onto the sheet in a coating chamber by cathode sputtering with a target of an alloy of 65% tin and 35% nickel in an atmosphere with an oxygen content. The sheet and coating are then heated at 640° C. and then bent in the heated state, thus producing an especially stable and electrically conductive combination.

4 Claims, 3 Drawing Sheets

METHOD FOR PRODUCING GLASS OF HIGH TRANSMISSION IN THE VISIBLE SPECTRAL RANGE AND LOW SOLAR ENERGY TRANSMISSION

This is a continuation application of application Ser. No. 189,768, filed May 3, 1988, now abandoned.

The invention relates to a method for the production of sheets of glass with a high transmission in the visible spectral range and low solar energy transmission, as well as to a glass sheet.

Such glass sheets are to pass the greatest possible percentage of the visible light and block the greatest possible percentage of solar radiation. In summertime this measure is intended to prevent the undesired thermal radiation of sunlight from entering rooms. Especially in motor vehicles this effect is especially undesirable on account of the sloping and therefore very large-area windshields and back windows.

DE-OS 33 07 661 and EP-OS 104 870 disclose the sandwiching of a silver coating and a very thin metal coating applied directly to the silver, between two oxide coatings, the thin metal coating protecting the silver coating against chemothermal attack in the production of the topmost oxide coating. If such a system of coatings, however, is exposed to temperatures above 150° C., the silver diffuses into the adjacent oxide and/or metal coating and a great increase is to be observed in the surface resistance and a corresponding reduction of the transmission of the coating system, i.e., two of the important properties of the coating system are impaired.

According to another method (DOS 35 43 178) it is therefore recommended to apply a multi-layer system onto substrates of mineral glass by means of a vacuum coating process whereby the glass is given a high reflectivity for thermal radiation combined with a high transmission of visible light. The applied system of coatings makes it possible to subject the initially flat, coated glass sheet to a bending process in which the softening temperature of the glass, of about 650° C., is reached without adversely affecting the properties of the coated glass sheet. The glass thus treated has a low electrical resistance as a result of the coating, so that the glass window can be heated by applying an electrical voltage.

If such panes of glass are combined with additional, uncoated panes to form laminated windows by the sandwiching method, they are especially suitable for use in motor vehicles as heatable front windshields or back windows while providing additional protection against intense solar radiation. In the case of laminated glass (VSG glass) of this kind, an elastic intermediate layer of a plastic (e.g., polyvinylbutyrate) is situated, without any inclusion of air, between two thin sheets of mineral glass. In a glass thus coated the coated side is in direct contact with the plastic. For the use of such laminated glass in motor vehicles it is, however, necessary that the glass achieve certain minimum levels for the transmission of visible light, and certain reflection values for visible light must not be exceeded. This is intended to assure that, even in the case of poor lighting conditions, sufficient visibility through the glass will be assured, and that reflections of light in the glass will not interfere with the driver's vision and mask the oncoming vehicles from him. A light transmission of 80+5% is generally required as the allowable limit for light transmission and reflection.

If sheets of glass coated by the method of the older patent application (DOS 35 43 178) are incorporated into laminated glass, the values of light transmission and reflection required by the European standard can generally be achieved. In particular, light transmissions of approximately 77% and light reflections of 13 to 14% are typically achieved. The transmissions achieved are just barely sufficient for production, because production tolerances of at least about 1% must be expected, which is then always still within the required limits. The reflection values are also within the required limits, but they are decidedly higher than those achieved with glass colored in the mass, for example, in the case of uncoated glazing or heat shielding glass. In glass of this kind the light reflection values are around 8%, i.e., they are decidedly lower than in the case of coated glass. As a result, dashboard parts or articles laid on the dashboard which do not have a dull black finish can produce visible and annoying reflections in the windshield.

These high light reflection values are not characteristic of the coated glasses, since the coated, curved individual sheets have reflection values of only 6 to 10% and light transmission values of up to 83%. Not until these coated glasses are assembled together with an additional uncoated glazing by means of a laminate film is there a decided loss of light transmission and an increase of the reflection to levels around 14%.

A conventional coating, such as is commonly used in connection with architectural glass (solar control coatings), consists generally of thin metallic coatings which are applied either in a single layer or embedded in oxide coatings. If such coatings are subjected to a heat treatment, these coatings react with atmospheric oxygen to form transparent oxides, causing the loss of the original sunlight blocking function. Other coatings which withstand such heat treatment, such as those described in DOS 35 43 178, can be used only in a laminate on account of their mechanical and chemical sensitivity, e.g., as laminated safety glass or insulating glass in which the coating itself is not directly exposed t environmental conditions.

It is the object of the invention to provide sheets of mineral glass——especially clear or easily colored (mass-colored) float glasses——with a thin coating which decidedly reduces solar energy transmission in comparison with uncoated glass. The glass sheets are thus preferentially flat float glasses to be coated by means of high-power cathode sputtering in a continuous vacuum coating apparatus for architectural glass, so that after the coating process they can be further worked to produce single-sheet safety glass. The properties of the coating are not to change appreciably even after further working to produce such single-sheet safety glass. Lastly, the process as a whole is to be performable economically.

The further working requires that the coated glass be able to be cut to size and to be subjected to a heat treatment of up to 640° C. In this heat treatment the sheets are brought to their final shape and hardened under appropriate cooling conditions. These finished, curved and hardened glasses are then to exhibit a lower transmission of incident solar energy than normal clear or tinted glass, but the light transmission is not to fall below limits established according to the application. For example, this limit for use as a side window in the front part of a motor vehicle is 70%, and in rear windows the light transmission can be suLstantially lower when external mirror coatings are applied. Furthermore, the coating must be mechanically and chemically very stable, since it is exposed to environmental conditions, preferably in the interior of the vehicle, and must also withstand window cleaning procedures.

This object is achieved according to the invention by a coating sputtered in a coating chamber by cathode sputtering from a target of an alloy of 65% tin and 35% nickel in an atmosphere having an oxygen content, the glass and coating then being heated to a temperature of about 640° C., resulting in a stable and electrically conductive combination.

Preferably, the percentage of the oxygen admitted into the coating chamber has a linear relationship to the power put into the cathode, the flow of oxygen being correctly adjusted when the optical transmission of the sputtered-on coating shows saturation after the coating has been heated at 640° C., independently of the treatment time ranging between 5 and 20 minutes.

It is advantageous to apply to the tin oxide/nickel oxide coating a protective coating of a metal oxide, e.g., tin oxide, indium oxide or aluminum oxide. In a preferred embodiment a transparent metal oxide coating, e.g., $SnO_2$, $In_2O_3$, $Al_2O_3$ or $SiO_2$, is applied between the substrate and the coating formed from tin oxide and nickel oxide.

For certain applications, especially in motor vehicles, a sheet of mineral glass of low solar energy transmission, with a coating sputtered onto the substrate from a target of an alloy of 65% tin and 35% nickel in an atmosphere having an oxygen content, which is heated to a temperature of about 640° C. after the sputtering operation, can be produced by bending the glass after the heat treatment.

BRIEF DESCRIPTION OF THE DRAWINGS

An example of the embodiment of the invention will be further explained below with the aid of FIGS. 1 to 3, wherein.

Figure 1:
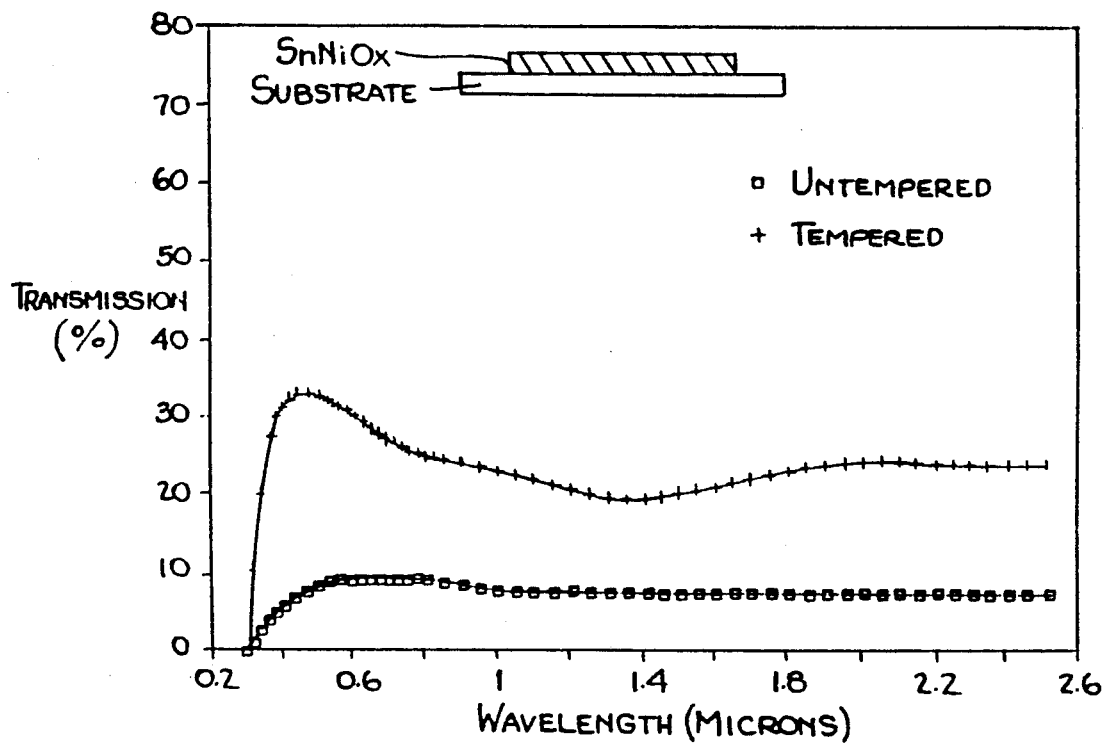
FIG. 1 shows a cross section through a glass sheet on which an SnNiOx coating has been sputtered, together with a representation of the transmission curve.

The stated object can be achieved by sputtering onto the flat substrate of clear or slightly greenish-colored float glass, by means of reactive high-power cathode spraying, a coating which is sputtered from a target with a composition of 65% tin and 35% nickel, the sputtering being done in an atmosphere which contains a certain amount of oxygen. The content of the admitted oxygen is a linear function of the power put into the cathode and must be determined once by experiment for a given sputtering arrangement. The amount of oxygen is correctly established when the optical transmission of the sprayed-on coating reaches the desired saturation level in a heat treatment at about 640° C. For a coating with a thickness of about 90 nm, the specific resistance is reduced from a value of about 360 ohms per centimeter to about 120 ohms per centimeter by the heat treatment. But if the oxygen content of the coating is too high a very great increase in the specific resistance of the coating will occur, as well as a complete oxidation of the coating as a consequence of the heat treatment, which is manifested by the fact that the coating becomes transparent. This behavior is characteristic of thin metallic coatings applied by sputtering or from a vapor, if they are tempered in air.

The alloy referred to forms a stable and conductive combination if the coating is prepared according t the stated formula and then is heated in air to temperatures of approximately >640° C. This is proven by the fact that additional subsequent heat treatments produce no important changes in the specific resistance and the transmission of the coated glass once the coated glass has been subjected to a tempering treatment in air. Owing to this behavior it becomes possible that the final state of the coated glass depends but little on the exact duration and course of the heat treatment, i.e., in the course of the heat treatment the transmission and the specific resistance of the coated glass approach a saturation value which is established by the coating parameters such as coating density and oxygen content. This is the condition required for the achievement of reproducible properties of the coated glasses in the production process.

If the adjustment of the coating composition is correct, the heat treatment in the production, however, not only results in a reduction in the specific resistance, but also the desired characteristic develops in the transmission of the coating, i.e., a transmission maximum in the visible spectral range and a reduced transmission in the near infrared range, as is made clear by the corresponding transmission curves. The transmission of visible light by the tempered glass can be adjusted simply through the thickness of the applied coating. For transmission values of more than 50% in the visible spectral range, the said coating is preferably also covered with an additional transparent oxide coating such as, for example, tin oxide, indium-tin oxide, aluminum oxide, etc., since this further improves the mechanical and chemical stability. For coatings of less than 50% transmission the thickness of the SnNi suboxide coating alone is sufficient.

Another variant method of production is to embed the active SnNi suboxide coating into two transparent oxide coatings of $SnO_2$, $In_2O_3$, $Al_2O_3$, $SiO_2$, etc. This makes it possible to achieve certain desired color effects or to influence the reflectance of the coating in the visible range by interference effects in the manner frequently used with other optical coatings for architectural purposes.

A special embodiment is the coating of glass colored in the mass, especially green glass, since the thermal barrier action of these glasses is improved substantially and can be optimized for a particular application by such coating.

Important advantages of this method are that by the sputtering on of a relatively simple coating (one layer) of a particular composition, the desired properties can be achieved by using the tempering process that is necessary anyway in the further processing. Since the sputtered-on coating is not a pure metallic coating, which in general would be relatively thin and therefore not very stable chemically and mechanically, but a relatively hard, semitransparent suboxide coating composed of commercially available materials, the requirements as to mechanical and chemical stability mentioned above can be achieved, as well as low-cost production.

Figure 4:
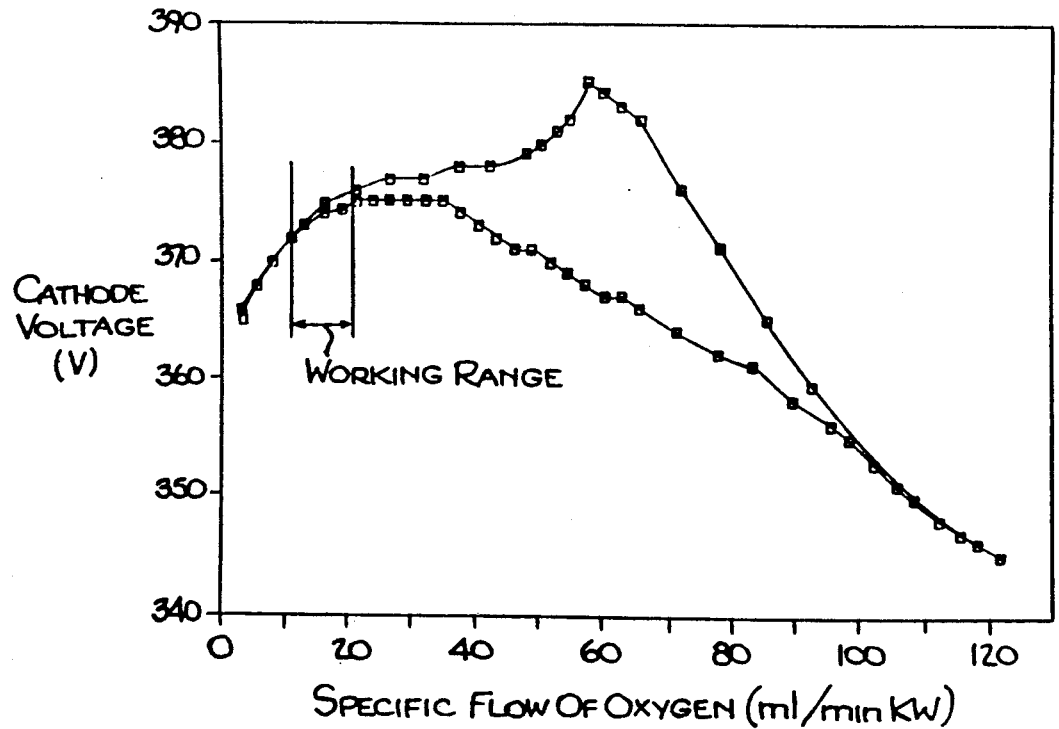
FIGS. 4 to 6 show different sputtering characteristic curves for various cathode currents as a function of the admitted oxygen, for an SnNi target with marked working ranges for different coating properties.
Figure 5:
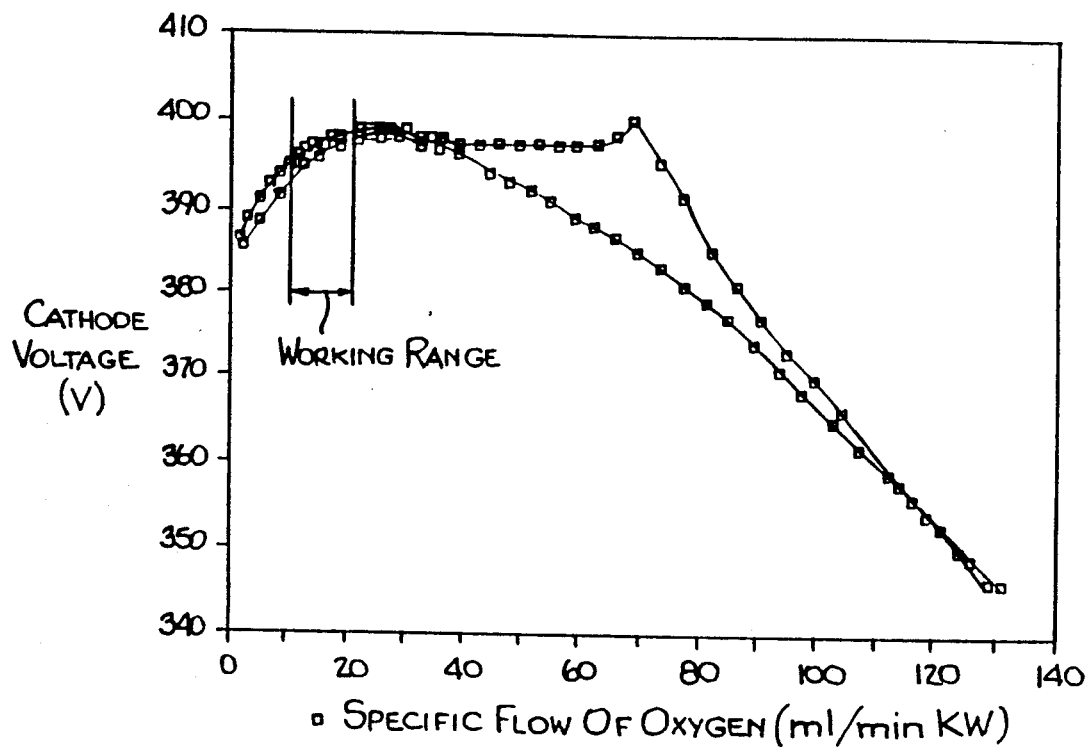
Figure 6:
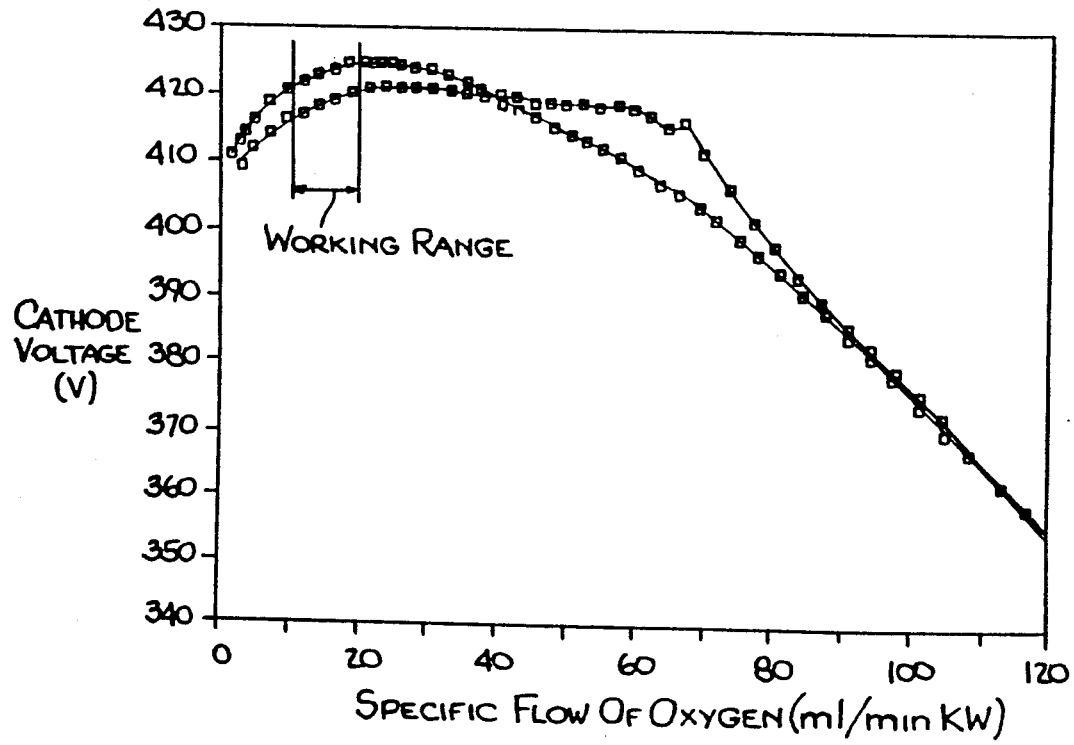

In a typical embodiment, float glasses size 2×50×50 mm were provided in a cathode sputtering apparatus with a tin-nickel coating sputterd on in an argon-oxygen atmosphere, the target composition amounting to 65% tin and 35% nickel. By means of the characteristic curve of the discharge, i.e., the behavior of the voltage of the magnetron discharge at constant current as a function of the oxygen admitted through a mass-flow regulator, the range that is necessary for the desired coating composition can be defined. This range is marked on the graphically represented characteristic (FIGS. 4, 5 and 6). Several coatings of different thickness were applied, whose parameters are summarized in the table below.

Figure 2:
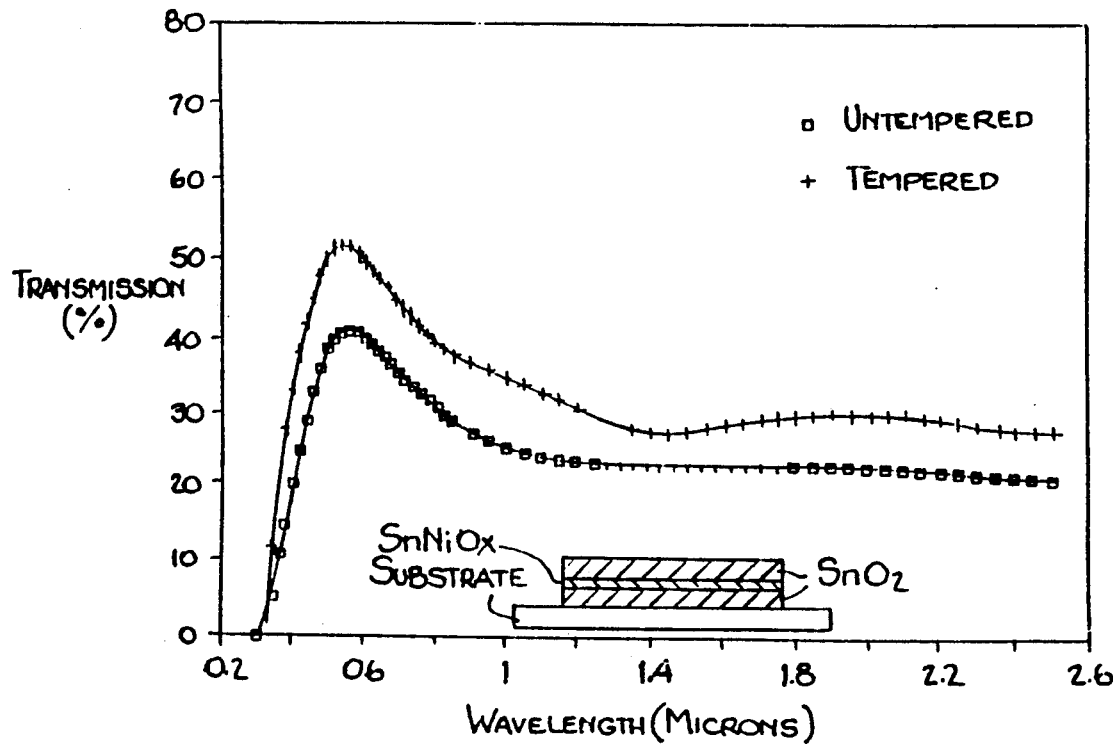
FIG. 2 shows a cross section through a triple coating system, together with a representation of the transmission measured before and after the heat treatment.
Figure 3:
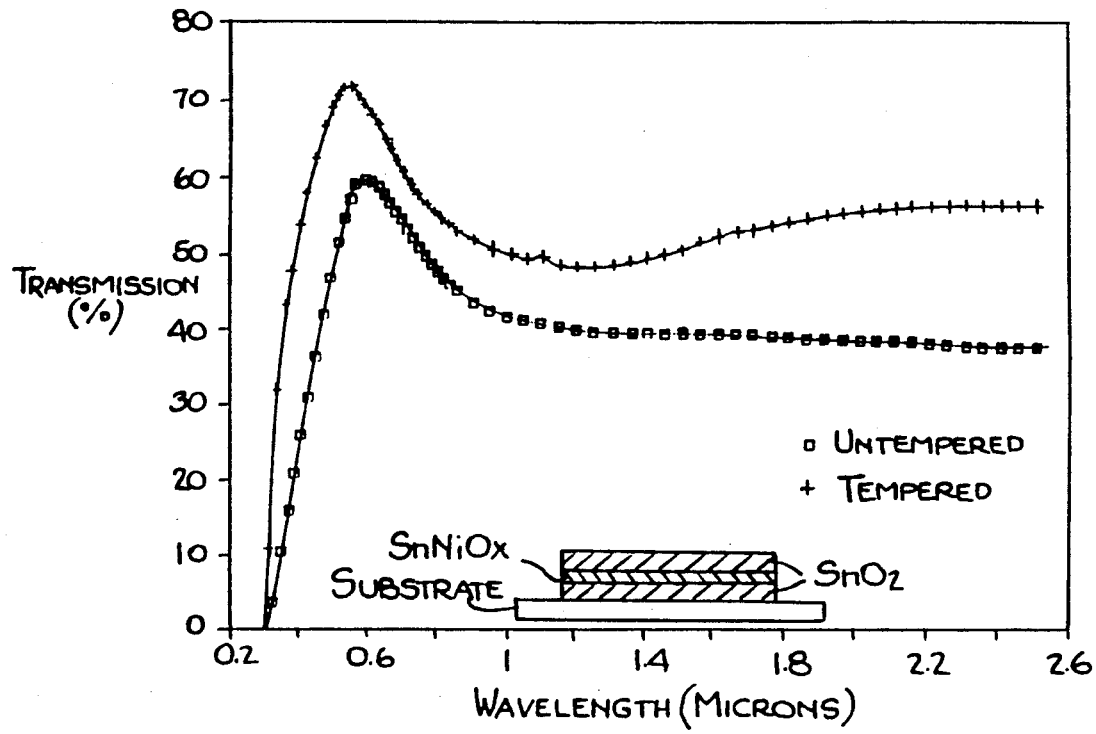
FIG. 3 shows a section through an additional triple coating system, together with a representation of the transmission measured before and after the heat treatment.

The transmission of these coatings in the visible and near infrared range was measured with the aid of a spectral photometer, both immediately after coating and after a heat treatment of 5 and 10 minutes at 650° C. in air. These values are represented graphically in FIGS. 1 to 3. The thicknesses of the coatings and their specific resistances, which were measured with a four-point resistance measuring apparatus and by means of a stylus method, are summarized in the three tables below.

Furthermore, a coating was sputtered on in the manner described above, and onto this first coating an additional transparent tin oxide coating was applied by the reactive sputtering of a tin target in a suitable argon-oxygen atmosphere immediately following the production of the first coating, in the same coating apparatus. This "sandwich" was likewise subjected to the described heat treatment. The transmission, resistance and thicknesses measured are also summarized in tabular form.

| Tin-nickel (first coating), sputtered on with 3 sccm $O_2$ | | |
|---|---|---|
| | Heat Treatment | |
| | Before | After (640° C./5 min) |
| Coating thickness | 54 nm | 54 nm |
| Specific resistance | 481 microohms/cm | 216 microohms/cm |
| Light admittance | 9% | 33% |

| Coating system oxide/SnNi (suboxidic) 3 sccm $O_2$/oxide | | |
|---|---|---|
| | | Heat Treatment |
| | Before | After (640° C. 5 min.) / After (640° C. 10 min.) |

| | Before | After (640° C. 5 min.) | After (640° C. 10 min.) |
|---|---|---|---|
| Coating thickness | 27 nm | 27 nm | 27 nm |
| Specific resistance in microohms/cm | 456 | approx. 270 | approx. 270 |
| Light admittance | 40% | 53% | 53% |

| Coating system oxide/SnNi (suboxidic) 3 sccm $O_2$/oxide | | | |
|---|---|---|---|
| | | Heat Treatment | |
| | Before | After (640° C. 5 min.) | After (640° C. 10 min.) |
| Coating thickness | 13.5 nm | 13.5 nm | 13.5 nm |
| Specific resistance | 452 microohms/cm | 2.0 ohms/cm | 1.5 ohms/cm |
| Light admittance | 57% | 72% | 72% |

We claim:

1. Method for the production of sheets of mineral glass with high transmission in the visible spectral range and with low solar energy transmission, comprising: cathode sputtering a coating onto a sheet of glass in a coating chamber by cathode sputtering from a target of an alloy of 65% tin and 35% nickel in an atmosphere with an oxygen content to thus form a Sn-Ni suboxide coating on the glass and then heating the glass and coating in air to a temperature of about 640° C. temper the coated glass, the tempering resulting in a stable and electrically conductive combination for said coating; the coating and tempering steps resulting in the providing of a sheet of mineral glass with high transmission in the visible spectral range and low solar energy transmission.

2. Method according to claim 1, in which the amount of oxygen in the coating chamber is correctly adjusted when the optical transmission of the sputtered-on coating, after heating the coating to 640° C., shows a saturation value, independently of the heat treatment time ranging from 5 to 20 minutes.

3. Method according to claim 1 comprising: applying a protective coating of a metal oxide onto the tin nickel suboxide coating.

4. Method according to claim 3, comprising: applying a transparent metal oxide coating onto the glass prior to the cathode sputtering.

* * * * *